United States Patent
Bellaouar et al.

(10) Patent No.: US 8,836,434 B2
(45) Date of Patent: Sep. 16, 2014

(54) METHOD AND SYSTEM FOR CALIBRATING A FREQUENCY SYNTHESIZER

(75) Inventors: Abdellatif Bellaouar, Richardson, TX (US); Ahmed R. Fridi, Richardson, TX (US); Sher Jiun Fang, Allen, TX (US); Hamid Safiri, Plano, TX (US)

(73) Assignee: Icera Inc., Wilmington, DE (US)

( * ) Notice: Subject to any disclaimer, the term of this patent is extended or adjusted under 35 U.S.C. 154(b) by 36 days.

(21) Appl. No.: 13/062,583

(22) PCT Filed: Sep. 8, 2009

(86) PCT No.: PCT/CA2009/001239
§ 371 (c)(1),
(2), (4) Date: Mar. 7, 2011

(87) PCT Pub. No.: WO2010/025563
PCT Pub. Date: Mar. 11, 2010

(65) Prior Publication Data
US 2011/0163815 A1    Jul. 7, 2011

Related U.S. Application Data

(60) Provisional application No. 61/094,662, filed on Sep. 5, 2008.

(51) Int. Cl.
*H03L 7/00* (2006.01)
*H03L 7/197* (2006.01)
*H03C 3/09* (2006.01)
*H03L 7/093* (2006.01)

(52) U.S. Cl.
CPC .............. *H03L 7/093* (2013.01); *H03L 7/1976* (2013.01); *H03C 3/0925* (2013.01); *H03C 3/0933* (2013.01); *H03C 3/0991* (2013.01)

USPC .............. 331/16; 331/34; 331/175; 331/183; 327/156; 327/159; 455/260

(58) Field of Classification Search
USPC .............. 331/16, 34, 1 A, 175; 327/156, 159; 455/260
See application file for complete search history.

(56) References Cited

U.S. PATENT DOCUMENTS 7,019,595 B1    3/2006   Lo et al.
7,298,219 B2 *  11/2007  Dosho et al. .................... 331/16

(Continued)

FOREIGN PATENT DOCUMENTS

GB    2233844 A      1/1991
WO    2010025563 A1  3/2010

OTHER PUBLICATIONS

Combined Search and Examination Report under Sections 17 and 18(3); Application No. GB1212699O1, Oct. 1, 2012, 2 pages.

*Primary Examiner* — Arnold Kinkead

(57) ABSTRACT

A digital frequency synthesizer with an automatic calibration system. The digital frequency synthesizer is calibrated by initiating a coarse tuning operation to rapidly reach a preliminary frequency that is proximate to the desired final frequency. A calibration procedure is then executed for adjusting gain in the frequency synthesizer based on the preliminary frequency. This test involves applying one or more test signals to the frequency synthesizer and measuring a signal generated in the frequency synthesizer. This measured signal corresponds to a gain response of the circuit at the preliminary frequency. When the expected gain is known, any difference relative to the gain of the measured signal is used to adjust the gain in a circuit of the frequency synthesizer such that the actual gain substantially matches the expected gain.

33 Claims, 7 Drawing Sheets

(56) References Cited

U.S. PATENT DOCUMENTS

2003/0119467 A1 6/2003 Welland et al.
2005/0266817 A1 12/2005 Welland et al.
2007/0030079 A1 2/2007 Kawamoto et al.
2007/0182494 A1 8/2007 Talwalkar

* cited by examiner

METHOD AND SYSTEM FOR CALIBRATING A FREQUENCY SYNTHESIZER

CROSS-REFERENCE TO RELATED APPLICATION

This application is the National Stage of, and therefore claims the benefit of, International Application No. PCT/CA2009/001239 filed on Sep. 8, 2009, entitled "METHOD AND SYSTEM FOR CALIBRATING A FREQUENCY SYNTHESIZER," which was published in English under International Publication Number WO 2010/025563 on Mar. 11, 2010, and has a priority date of Sep. 5, 2008, based on U.S. Provisional Application Ser. No. 61/094,662. Each of the above applications is commonly assigned with this National Stage application and is incorporated herein by reference in their entirety.

FIELD OF THE INVENTION

The present invention relates generally to wireless transceivers. More particularly, the present invention relates to calibration of frequency synthesizers.

BACKGROUND OF THE INVENTION

Wireless devices have been in use for many years for enabling mobile communication of voice and data. Such devices can include mobile phones and wireless enabled personal digital assistants (PDA's) for example. FIG. 1 is a generic block diagram of the core components of such wireless devices. The wireless core 10 includes a base band processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18 via a gain circuit 22. Those of skill in the art should understand that FIG. 1 is a simplified block diagram, and can include other functional blocks that may be necessary to enable proper operation or functionality.

Generally, the transmitter core 20 is responsible for up-converting electromagnetic signals from base band to higher frequencies for transmission, while receiver core 16 is responsible for down-converting those high frequencies back to their original frequency band when they reach the receiver, processes known as up-conversion and down-conversion (or modulation and demodulation) respectively. The original (or base band) signal, may be, for example, data, voice or video. These base band signals may be produced by transducers such as microphones or video cameras, be computer generated, or transferred from an electronic storage device. In general, the high frequencies provide longer range and higher capacity channels than base band signals, and because high frequency radio frequency (RF) signals can propagate through the air, they are preferably used for wireless transmissions.

All of these signals are generally referred to as radio frequency (RF) signals, which are electromagnetic signals; that is, waveforms with electrical and magnetic properties within the electromagnetic spectrum normally associated with radio wave propagation.

In certain communications standards such as the well known GSM standard, various modulation techniques are available for transmitting data. One such technique is GMSK (Gaussian Minimum Shift Keying) modulation, which is generally preferred over other modulation techniques due to its relatively higher spectral efficiency and reduced side-band power. Generally, GMSK modulation is a form of frequency modulation for coding bits of data being transmitted, and other frequency modulation techniques can be used instead of GMSK. For any frequency modulation technique, the transmitter core 20 includes a frequency synthesizer circuit for generating the modulated frequency signal to be used in downstream transmit circuits of the transmitter core 20.

FIG. 2 is a block diagram of a prior art frequency synthesizer that is used for generating a modulated frequency output signal Fout in response to a reference clock signal CLK_ref and a modulation signal MOD_WD. Frequency synthesizer 30 includes a loop consisting of a phase frequency detector (PFD) 32, a charge pump 34, an analog filter 36, a voltage controlled oscillator (VCO) 38, and a frequency divider 40. The PFD 32 determines the difference in phase between CLK_ref and the feedback signal from frequency divider 40, which is used by charge pump 34 to generate a charge corresponding to this difference. The analog filter restricts bandwidth of the closed loop system and filters out unwanted noise. The VCO 38 phase is adjusted by the charge provided by charge pump 34. The frequency divider 40 then divides Fout by a value N, which is generally set by the base band processor for the application. Assuming N does not change, the loop will eventually lock such that the phase of Fout is matched to the phase of CLK_ref. For frequency modulation applications, a well known sigma-delta modulator 42 is provided for receiving a digital word that adjusts the value of N of frequency divider 40. This digital word is provided at a frequency necessary for modulating Fout.

One of the issues of the frequency synthesizer 30 is that the circuit has a particular closed loop frequency response, primarily due to the presence of analog components such as charge pump 34, analog filter 36 and VCO 38 which are each sensitive to process, voltage and temperature (PVT) variations. FIG. 3A is a graph of an example closed loop frequency response for frequency synthesizer 30. If this closed loop frequency response is known through simulation or calculations based on the circuit design, then the frequency at which new modulation words can be applied to sigma-delta modulator 42 should be less than $f_L$. Frequency $f_L$ is the loop bandwidth of the frequency synthesizer. However, any tone lying beyond $f_L$ will have its amplitude attenuated by the closed loop frequency response of the circuit. Those skilled in the art should understand that the gain should remain substantially constant during frequency modulation. Unfortunately, $f_L$ is preferably minimized to minimize noise in the circuit, which thereby restricts the rate of modulation that is allowed, which impacts performance of the circuit and the wireless system.

The known solution to this problem is to add a pre-emphasis filter 44 that compensates for the native closed loop frequency response of frequency synthesizer 30 beyond $f_L$. FIG. 3B is a graph of an example filter response for pre-emphasis filter 44. In simplified terms, pre-emphasis filter 44 amplifies the received signal by a predetermined factor before it is received by sigma-delta modulator 42. Therefore, the signal is "boosted" and then attenuated by the closed loop frequency response of frequency synthesizer 30. The net change should be substantially zero. Therefore, the rate of modulation can be increased beyond $f_L$ while maintaining a constant amplitude of Fout.

The problem with this system is determining the parameters of pre-emphasis filter 44 that complements the actual closed loop frequency response of frequency synthesizer 30. A theoretically calculated closed loop frequency response of frequency synthesizer 30 can be made prior to fabrication, but the aforementioned PVT sensitivity of the analog circuits will change the actual closed loop frequency response. Fabricated batches of devices can vary from each other due to process variation, and even devices within the same fabricated batch of devices can vary from each other due to process variation. Compounding this problem is the fact that voltage and temperature can change at any time while the wireless device is turned on. Therefore, a theoretically calculated filter response is of little use for designing the proper pre-emphasis filter 44 before fabrication.

It is, therefore, desirable to provide a frequency synthesizer circuit that compensates for closed loop frequency responses due to PVT variation.

SUMMARY OF THE INVENTION

It is an object of the present invention to obviate or mitigate at least one disadvantage of previous frequency synthesizers.

In a first aspect, the present invention provides a method for generating an output frequency from a frequency synthesizer. The method includes coarse tuning a voltage controlled oscillator for generating a preliminary frequency proximate to the output frequency; applying at least one test signal to the frequency synthesizer; determining a difference between a predetermined gain and actual gain corresponding to the at least one test signal; adjusting gain of a circuit in the frequency synthesizer to compensate for the difference; and fine tuning the voltage controlled oscillator for generating the output frequency. According to a present embodiment, the step of applying includes applying a first test signal followed by a second test signal, where the first test signal corresponds to a first voltage and the second test signal corresponds to a second voltage. The first test signal can be a first digital word representing the first voltage and the second test signal can be a second digital word representing the second voltage. In this present embodiment, the step of determining includes measuring a first output frequency in response to the first test signal and a second output frequency in response to the second test signal for calculating a measured tuning sensitivity. The step of adjusting includes changing a gain of a digitally adjustable filter by the gain adjustment factor. The step of applying includes selectively coupling the first test signal and the second test signal to an adjustable oscillation circuit that provides the first output frequency and the second output frequency during a calibration process. The step of fine tuning includes selectively coupling the digitally adjustable filter to the adjustable oscillation circuit that provides the output frequency.

According to another embodiment, the frequency synthesizer includes a digital to analog converter for controlling a voltage controlled oscillator, and the step of applying includes providing a test signal corresponding to a predetermined tone having an amplitude of $½^k$ to an adjustable pre-emphasis filter, where k is any integer value; and increasing a bandwidth of an adjustable digital filter by a factor of N, where N is an integer value greater than 1. An output of the adjustable digital filter is designed to be $N*Fref/2^k(Kv*Kdac)$, where Fref is a reference frequency received by the frequency synthesizer, Kdac is the digital to analog converter tuning sensitivity, and Kv is the voltage controlled oscillator tuning sensitivity. In the present embodiment, the step of providing includes amplifying the test signal with the adjustable pre-emphasis filter in response to a default filter response configuration setting. The step of determining includes measuring a peak amplitude at the output of the digitally adjustable filter, and comparing the measured Kv*Kdac to a designed Kv*Kdac. The step of adjusting includes providing a new filter response configuration setting when the comparison mismatches.

In yet a further embodiment of the present aspect, steps b) to d) are executed in a first iteration to provide coarse calibration of the frequency synthesizer, and steps b) to d) are executed in a second iteration to provide fine calibration of the frequency synthesizer prior to the step of fine tuning. The step of applying during the first iteration includes applying a first digital word and a second digital word to measure a first output frequency in response to the first digital word and a second output frequency in response to the second digital word, for calculating a coarse tuning sensitivity of the frequency synthesizer. The step of adjusting includes generating a gain adjustment factor by dividing the measured tuning sensitivity by a desired tuning sensitivity, and changing a gain of a digitally adjustable filter by the gain adjustment factor. In the present embodiment, the step of applying during the second iteration includes providing a predetermined tone having an amplitude of $½^k$ to an adjustable pre-emphasis filter receiving a default filter response configuration setting, where k is any integer value, and increasing a bandwidth of an adjustable digital filter by a factor of N, where N is an integer value greater than 1, and an output of the adjustable digital filter is designed to be $N*Fref/2^k(Kv*Kdac)$, where Fref is a reference frequency received by the frequency synthesizer, Kdac is the digital to analog converter tuning sensitivity, and Kv is the voltage controlled oscillator tuning sensitivity. The step of determining includes measuring a peak amplitude at the output of the digitally adjustable filter, and comparing the measured Kv*Kdac to a designed Kv*Kdac. The step of adjusting includes providing a new filter response configuration setting when the comparison mismatches.

In a second aspect, the present invention provides a closed-loop frequency synthesizer. The closed-loop frequency synthesizer includes phase detection circuitry, an adjustable digital filter, calibration circuitry, an adjustable frequency generator and a divider. The phase detection circuitry provides a digital phase signal corresponding to a difference in phase between a reference clock and divided clock. The adjustable digital filter receives the digital phase signal and provides a fine adjustment signal, the digital filter having at least one electrical characteristic adjustable during a calibration phase for determining a characteristic gain of the frequency synthesizer. The calibration circuitry adjusts the at least one electrical characteristic of the adjustable filter during the calibration phase. The adjustable frequency generator generates an output frequency in response to the fine adjustment signal. The divider divides the output frequency by a selected factor to generate the divided clock.

In the present embodiment, the adjustable oscillation circuit includes a digital to analog converter, a coarse adjuster and a voltage controlled oscillator. The digital to analog converter generates a fine adjustment signal in response to the filtered digital phase signal. The coarse adjuster generates a coarse adjustment signal in response to a difference between a predetermined output frequency and the output frequency. The voltage controlled oscillator generates the output frequency in response to the fine adjustment signal and the coarse adjustment signal.

The closed-loop frequency synthesizer further includes a selector for passing at least one test signal to the frequency synthesizer during the calibration phase. The at least one test signal includes a first test signal corresponding to a first voltage and a second test signal corresponding to a second voltage, and the selector passes the first voltage and the second voltage to the digital to analog converter at different times. The calibration circuitry includes a gain estimator for measuring a first output frequency corresponding to the first voltage and a second output frequency corresponding to the second voltage from the voltage controlled oscillator. The gain estimator calculates a measured tuning sensitivity and generates a gain adjustment factor by dividing the measured tuning sensitivity by a desired tuning sensitivity. The at least one electrical characteristic of the adjustable digital filter includes gain being adjustable in response to the gain adjustment factor.

In another embodiment, the at least one test signal includes a predetermined tone having an amplitude of $\frac{1}{2}^k$, where k is any integer value. The closed-loop frequency synthesizer further includes an adjustable pre emphasis filter and a sigma delta modulator. The adjustable pre emphasis filter amplifies the predetermined tone in response to changing filter response configuration settings for providing an amplified tone. The sigma delta modulator converts the amplified tone into a divide signal corresponding to the selected factor used by the divider. In the present embodiment, the at least one electrical characteristic of the adjustable digital filter includes a bandwidth that is increased by a factor of N during the calibration phase, where N is an integer value greater than 1. An output of the adjustable digital filter is designed to be $N*Fref/2^k$ (Kv*Kdac), where Fref is a reference frequency received by the frequency synthesizer, Kdac is the digital to analog converter tuning sensitivity, and Kv is the voltage controlled oscillator tuning sensitivity. The calibration circuitry includes a peak detector and a lookup table. The peak detector measures a peak amplitude of the output of the adjustable digital filter, and compares the measured Kv*Kdac to a designed Kv*Kdac. The lookup table provides a new filter response configuration setting when the measured Kv*Kdac and the designed Kv*Kdac mismatch. In another alternate embodiment, the adjustable digital filter has a filter gain adjusted during a coarse calibration operation of the calibration phase, and the adjustable pre emphasis filter has a filter gain adjusted during a fine calibration operation of the calibration phase.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a digital frequency synthesizer with an automatic calibration system. The digital frequency synthesizer is calibrated by initiating a coarse tuning operation to rapidly reach a preliminary frequency that is proximate to the desired final frequency. A test procedure is then executed for adjusting gain in the frequency synthesizer based on the preliminary frequency. This test involves applying one or more test signals to the frequency synthesizer and measuring a signal generated in the frequency synthesizer. This measured signal corresponds to a gain response of the circuit at the preliminary frequency. When the expected gain is known, any difference relative to the gain of the measured signal is used to adjust the gain in a circuit of the frequency synthesizer such that the actual gain substantially matches the expected gain.

In order to minimize the effects of PVT, the frequency synthesizer of the present embodiments has been designed with minimal analog circuitry. In otherwords, a maximum number of circuits have been implemented in CMOS digital circuitry. Those skilled in the art should understand that digital circuit implementation of traditional analog circuits are more PVT insensitive than their analog circuit counterparts. Furthermore, they are readily scalable with each fabrication process generation, where analog circuits are not.

Figure 4:
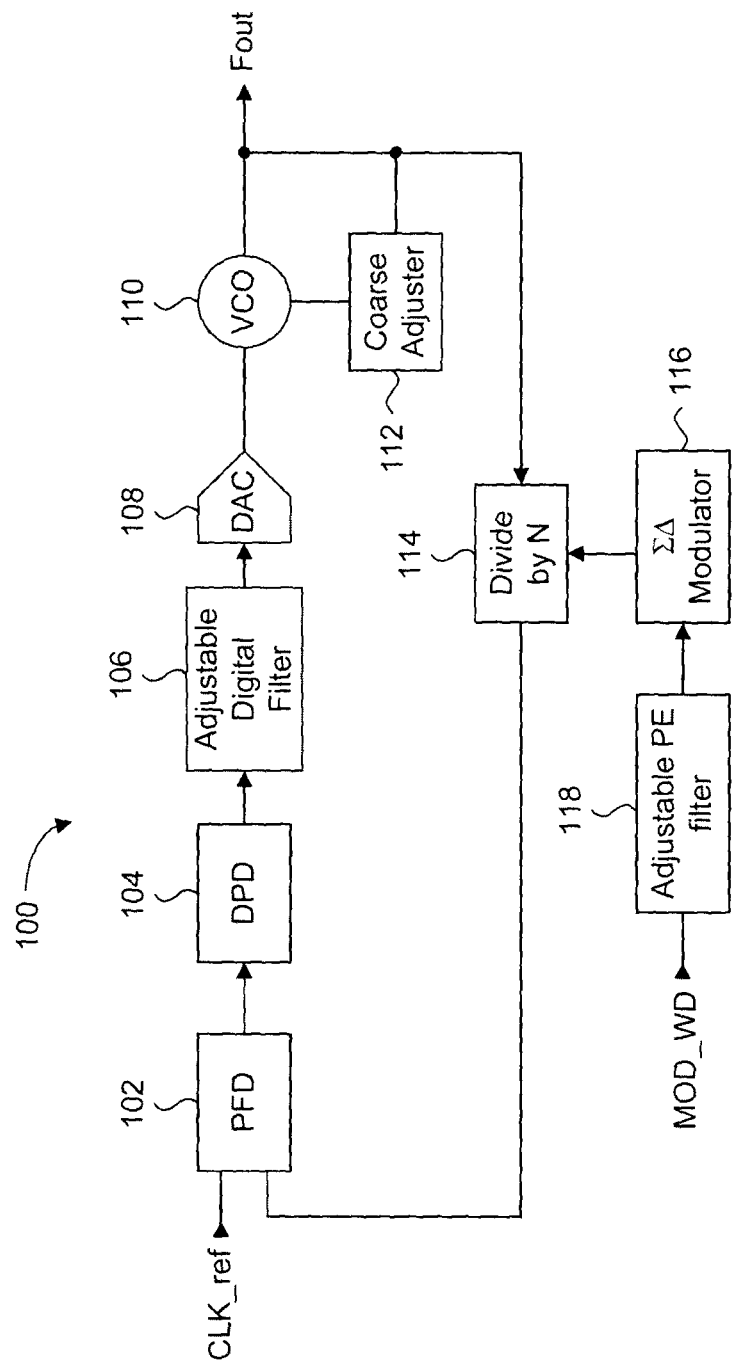
FIG. 4 is a block diagram of a digital frequency synthesizer, according to a present embodiment.

FIG. 4 is a block diagram of a digital frequency synthesizer, according to a present embodiment. Digital frequency synthesizer 100 is considered a phase locked loop circuit PLL that minimizes the number of analog circuit components, and includes phase detection circuitry, a digital filter, an adjustable frequency generator and a divider. The phase detection circuitry includes a phase frequency detector (PFD) 102 and a digital phase detector (DPD) 104. The PFD 102 receives a reference clock CLK_ref and a feedback clock signal to provide a pulse representing the difference in phase between the two input signals. The DPD 104 converts the received pulse into a digital word corresponding to the time duration of the pulse. The DPD 104 can be implemented with circuits known as a time to digital converter which are known in the art, and described in detail in commonly owned PCT Patent Publication No. WO 2008/074129 titled DIGITAL CHARGE PUMP PLL ARCHITECTURE". Following is an adjustable filter 106 having at least one electrical characteristic that is adjustable. In the present embodiments, examples of such electrical characteristic include the gain of the filter and the bandwidth of the filter. Both can be controlled digitally using known circuit techniques. The output of the adjustable filter 106 is referred to as a filtered digital phase signal, which is provided to an adjustable frequency generator that provides an output frequency Fout.

The adjustable frequency generator includes a digital to analog converter 108 having preset resolution, a voltage controlled oscillator (VCO) 110, and a coarse adjuster circuit 112. Generally, the adjustable frequency generator provides Fout in response to a combination of adjustment signals from the coarse adjuster circuit 112 and digital to analog converter 108. The coarse adjuster circuit 112 provides one or more coarse adjustment signals that control VCO 110 to provide Fout having a frequency that is proximate to the desired final output frequency. Coarse adjustment of VCO 110 can be done by coupling one or more of an array of switched capacitors to the circuit, which is a technique that is known in the art. The output frequency Fout can be referred to as a preliminary output frequency. The digital to analog converter 108 provides a fine adjustment signal that fine tunes VCO 110 to adjust the preliminary output frequency to the desired final output frequency. This fine adjustment signal can control a varactor within VCO 110, another technique which is known in the art. Coarse tuning of VCO 110 is done via coarse adjuster circuit 112 under an open loop condition, and fine tuning of VCO 110 is done under a closed loop condition.

Figure 1:
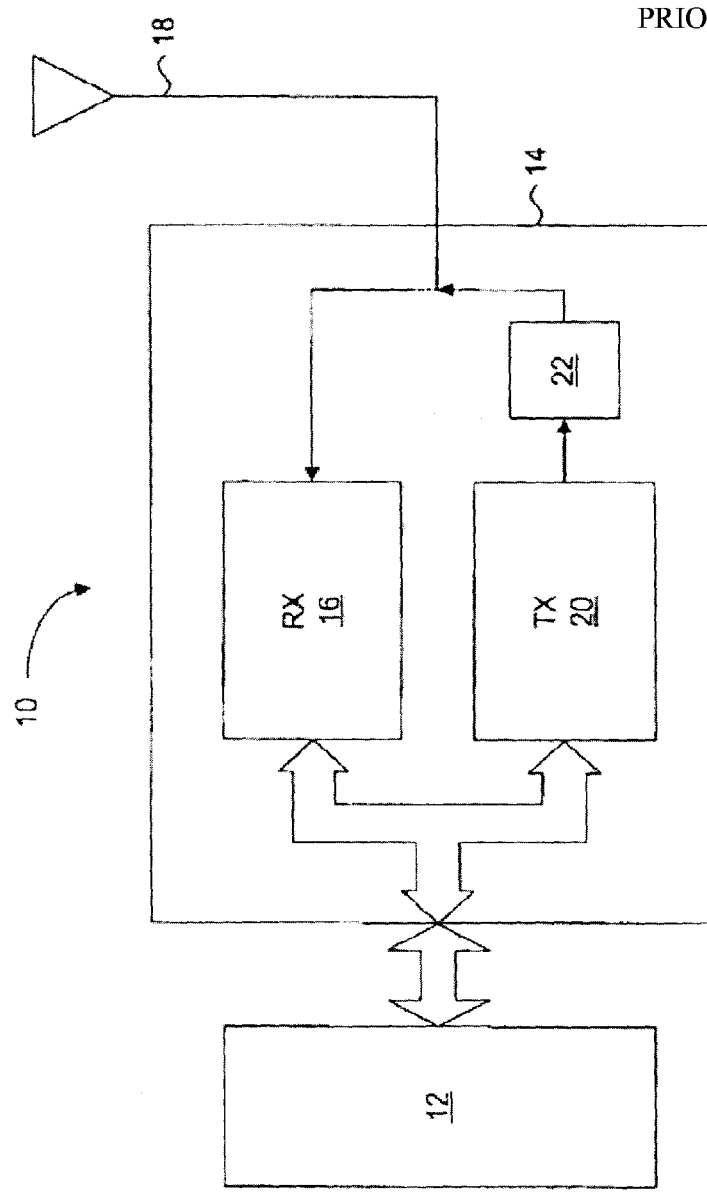
FIG. 1 is a block diagram of a known wireless transceiver circuit.
Figure 2:
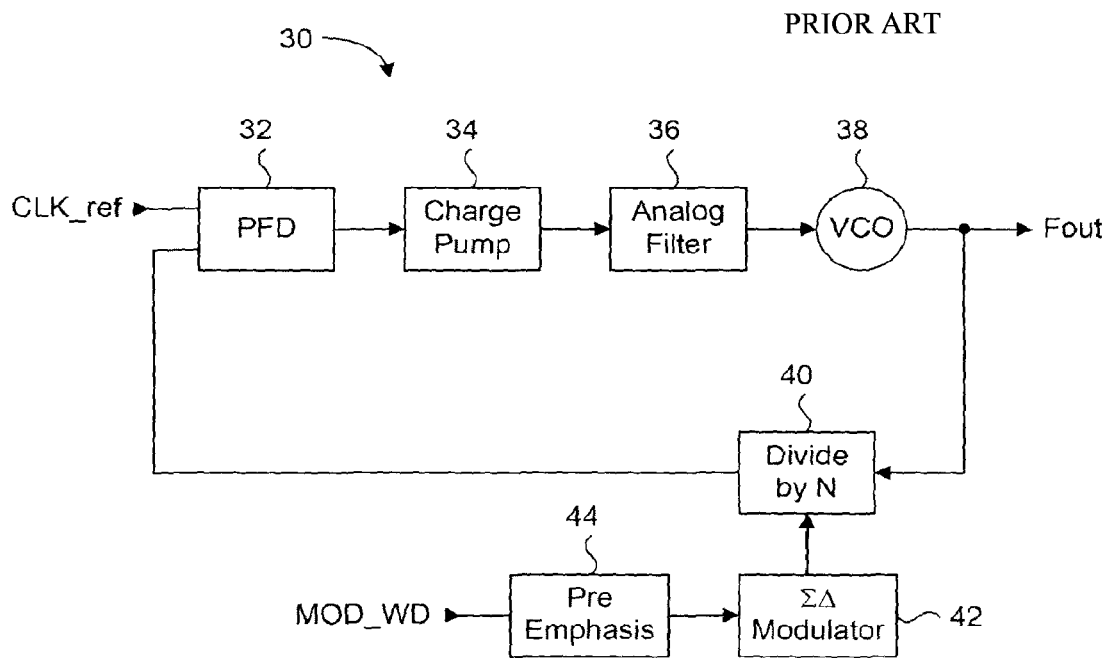
FIG. 2 is a block diagram of a frequency synthesizer of the prior art.
Figure 3A:
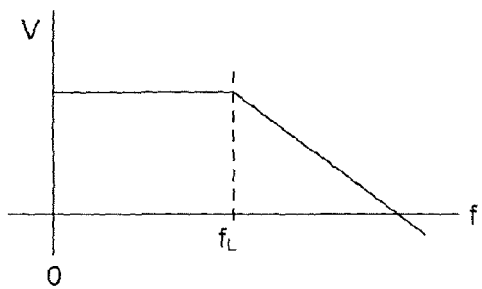
FIG. 3A is an example closed loop frequency response for the frequency synthesizer of FIG. 2.
Figure 3B:
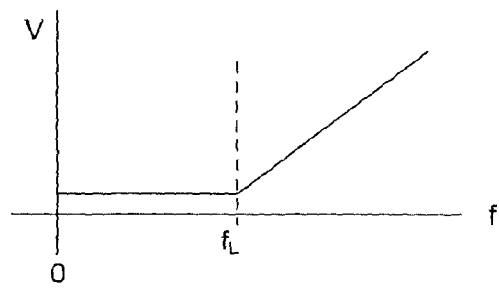
FIG. 3B is an example closed loop frequency response for the pre-emphasis filter of FIG. 2.

As part of the closed loop, Fout is fed back to frequency divider 114, which provides the divided clock signal back to another input of PFD 102. Frequency divider 114 can be the same as frequency divider 40 of FIG. 2. A sigma-delta modulator 116 can be the same as sigma-delta modulator 42, with the same function. According to the present embodiment, sigma-delta modulator 116 is controlled by an adjustable pre-emphasis filter 118 that receives a modulation word. Adjustable pre-emphasis filter 118 can have its gain response adjusted. With reference to FIG. 3B for example, the slope of the closed loop frequency response after $f_L$ can be adjusted in response to control signals (not shown). An advantage of frequency synthesizer 100 is that most of the circuit elements are digital, meaning that they have fabricated characteristics which follow expected designed characteristics. However, VCO 110 is still predominantly an analog circuit that is sensitive to PVT variation, which contributes to the closed loop frequency response of the circuit. Therefore, according to the present embodiments, one or both of adjustable filter 106 and adjustable pre-emphasis filter 118 can be used to compensate for the closed loop frequency response.

Figure 5:
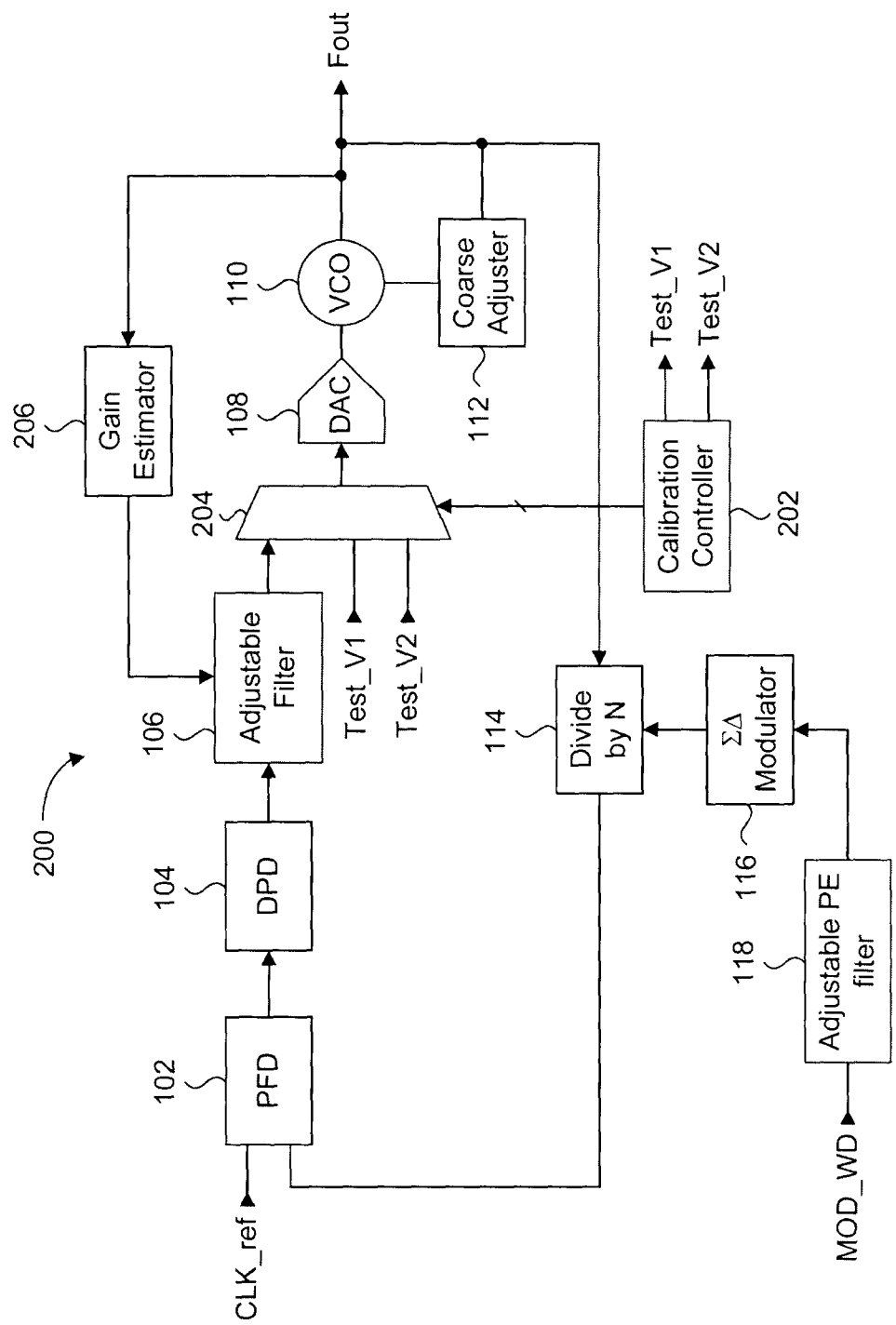
FIG. 5 is a schematic of a frequency synthesizer with calibration control circuits, according to a first embodiment.

FIG. 5 is a schematic of a frequency synthesizer with calibration circuitry, according to a first embodiment. Frequency synthesizer 200 includes all the circuit blocks shown in and previously described for frequency synthesizer 100 of FIG. 4, but now includes calibration circuitry which are used for adjusting an electrical characteristic or parameter of adjustable filter 106 in response to a determined rate of change of gain versus a corresponding change in frequency. In this embodiment, the adjustable filter 106 has an electrical characteristic of gain that is adjustable, while the adjustable pre-emphasis filter 118 is fixed to have a predetermined filter response. The calibration circuitry includes a calibration controller 202, a selector 204, and a gain estimator 206. The calibration controller 202 is controlled by the baseband processor to provide two different test signals Test_V1 and Test_V2, both being digital words representing different voltages. More specifically, these two voltages are selected to be well within the linear operating region of VCO 110. Calibration controller 202 further provides a multi-bit selection signal to selector 204, which passes one of Test_V1, Test_V2 and the output of adjustable filter 106 at different times or phases of a calibration operation. A first phase is a calibration phase in which calibration controller 202 controls selector 204 to first pass test signal Test_V1 to DAC 108 and then Test_V2 to DAC 108. A second phase is a gain adjustment phase where the measured frequencies are used to calculate a gain compensation value, which is then applied to adjustable filter 106.

Gain estimator 206 receives Fout from VCO 110 during the calibration phase to determine the rate of change of the frequency of Fout in response to a corresponding voltage change, such as in response to Test_V1 and Test_V2. This is referred to as a measured tuning sensitivity of the circuit. Once this difference is determined, gain estimator 206 provides a gain adjustment factor to adjustable filter 106. In the present embodiment, when Test_V1 is provided to DAC 108, VCO 110 generates Fout having a first preliminary frequency. When Test_V2 is provided to DAC 108, VCO 110 generates Fout having a second preliminary frequency. Since the values of Test_V1 and Test_V2 are known, gain estimator 206 can calculate a sampled Kv*Kdac Hz/DAC code, where the DAC code corresponds to the digital words of either Test_V1 or Test_V2, and compare it to a desired Kv*Kdac product. The difference can be used as a gain adjustment factor for adjustable filter 106. For example, if the result of the application of Test_V1 and Test_V2 yields a result of 10 kHz/DAC code and the desired Kv*Kdac product is 11 kHz/DAC code, then a gain adjustment factor of 11 kHz/10 kHz (1.1) is applied.

It is noted that Test_V1 and Test_V2 are digital words or codes, that are selected to correspond to any two voltages that fall within the linear operation region of VCO 110. Therefore, once Test_V1 and Test_V2 have been selected for the circuit design, the designed Kv*Kdac product can be determined and stored within gain estimator 206.

Figure 6:
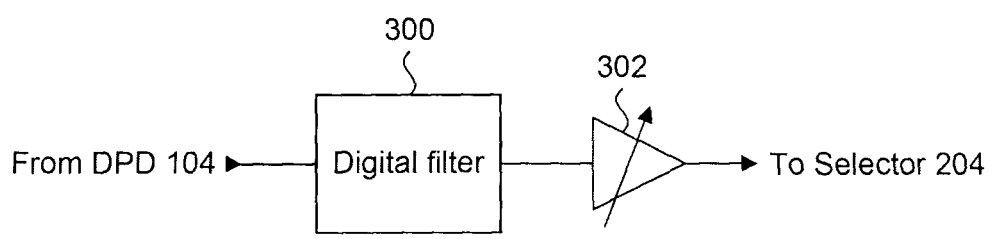
FIG. 6 is a schematic of a digital filter with adjustable gain.

FIG. 6 is a circuit diagram of one embodiment of adjustable filter 106, which consists of a digital filter 300 having an input for receiving the output of DPD 104, and an output coupled to the input of a variable digital gain circuit 302. Digital filter 300 can be any known type of digital filter, such as but not limited to, an FIR filter and an IIR filter, for example. The operation of such circuits are known in the art. It is noted that the desired Kv can be determined because most of the circuits are digitally implemented. Therefore the behavior of the fabricated circuits will not deviate substantially from the circuit design. Adjustable filter 106 can then be operated in the fine tuning phase to lock the VCO to the desired output frequency.

The frequency synthesizer embodiment of FIG. 5 has its adjustable pre-emphasis filter 118 fixed, meaning that its filter response is fixed. In particular, the gain response of adjustable pre-emphasis filter 118 after $f_L$ is set to have a predetermined slope, such as the upward slope shown in FIG. 3B. Therefore by dynamically changing the gain response of adjustable filter 106, the actual gain response of frequency synthesizer 200 can be adjusted to complement that of pre-emphasis filter 118. A dynamic change means that the change or adjustment can occur any number of times during operation of the wireless device. In the alternate embodiment of FIG. 7, the gain of adjustable filter 106 is fixed and the gain of adjustable pre-emphasis filter 118 is dynamically changed.

Figure 7:
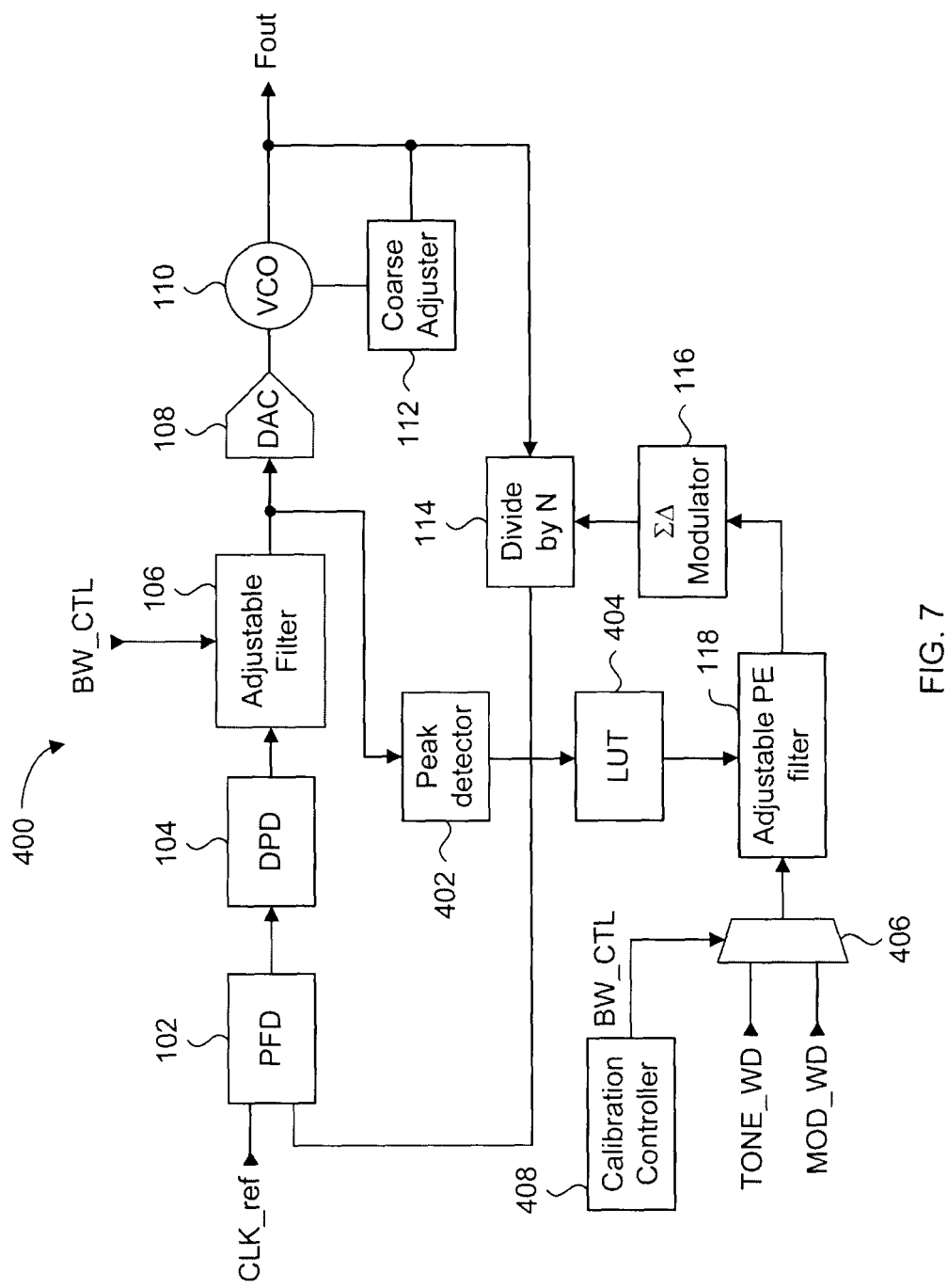
FIG. 7 is a schematic of a frequency synthesizer with calibration control circuits, according to a second embodiment.

FIG. 7 is a schematic of a frequency synthesizer with calibration control circuits, according to a second embodiment. Frequency synthesizer 400 includes all the circuit blocks shown in and previously described for frequency synthesizer 100 of FIG. 4, but includes calibration circuitry which are used for adjusting an electrical characteristic of adjustable pre-emphasis filter 118. The calibration circuits of FIG. 7 include a peak detector 402, a look up table (LUT) 404, a selector 406 and a calibration controller 408. In the present embodiment, electrical characteristics of pre-emphasis filter 118 and adjustable filter 106 are adjusted for the calibration process. More specifically, the bandwidth response of adjustable filter 106 can be set to a normal range used for normal transmit operations, and to a test range that is greater than the normal range for the calibration operation. For example, the calibration range can be 4 times greater than the normal range. With reference to FIG. 3A, $f_L$ would be extended to the right side direction such that the extended bandwidth=$4f_L$. The purpose for this extended bandwidth is to increase the speed at which a lock will occur. In the present embodiment, adjustable filter 106 receives a bandwidth control signal BW_CTL for switching the bandwidth between the normal range and the calibration range. Digital circuit techniques are known in the art for achieving this desired result. Connected to the output of adjustable filter 106 is peak detector 402. Peak detector 402 has an output that is received by LUT 404, which stores different configuration settings for adjustable pre-emphasis filter 118. Any one of these settings can be used by adjustable pre-emphasis filter 118 to change its gain characteristics after the designed predetermined limit $f_L$. Because adjustable pre-emphasis filter 118 is implemented with digital circuits, those skilled in the art will understand that different techniques can be used to make such an adjustment.

Selector 406 passes one of inputs MOD_WD and TONE_WD to the input of adjustable pre-emphasis filter 118. Test signal TONE_WD can be a predetermined tone, such as a 100 KHz tone having an amplitude being $\frac{1}{2}^k$ of the full scale of adjustable PE filter 118. The variable "k" can be any integer value. Selector 406 is controlled via a control signal provided by calibration controller 408, which indicates that the calibration phase is to be executed. In the present example of FIG. 7, this control signal can be BW_CTL that is also used for changing the bandwidth of adjustable filter 106 during the calibration process. The principle for compensating the gain in frequency synthesizer 400 during the calibration process is as follows. Because TONE_WD has a known frequency and amplitude, and adjustable pre-emphasis filter 118 has a default configuration with a closed loop frequency response, the expected output amplitude of adjustable filter 106 can be calculated with expression (1) below:

$$M*CLK\_ref/2^k(Kv*Kdac) \quad (1)$$

The variable M is the factor by which the bandwidth of the loop is increased by, the parameter Kv corresponds to a gain of VCO 110, and Kdac is the tuning sensitivity of DAC 108, both of which are theoretically known from the design of the respective circuits. Therefore, by measuring the output peak of adjustable filter 106, the actual product of (Kv*Kdac) can be calculated and compared to the expected product of (Kv*Kdac). While there is a mis-match between the actual and expected values, the closed loop frequency response of pre-emphasis filter 118 can be iteratively changed and thus set to a different configuration entry from LUT 404. LUT 404 can be designed into include any number of entries, and the difference in gain characteristics of adjacent entries can be set to any resolution. The closest matching suitable entry in LUT 404 is eventually locked in for subsequent tuning of frequency synthesizer 400.

Following is an example calculation using expression (1) above. If $2^k=512$, Kv=40 MHz/V, Kdac=1V for full code, CLK_ref=250 MHz, then the amplitude at the filter output will be approximately 1/20 of the full scale. The amplitude at the output of adjustable filter 106 is dependent only on the product of Kv*Kdac which is sensitive to PVT variation, since the other terms are fixed.

The frequency synthesizer embodiments 200 and 400 of FIGS. 5 and 7 respectively, have been described as alternate embodiments of each other, in that either could be used in place of the other. While the embodiment of FIG. 5 is simple to implement, the accuracy of the frequency estimation per test signal (Test_V1 and Test_V2) is improved if a longer period of time is allowed to pass before the measurement by gain estimator 206 is executed. For example, simulated measurements for frequency synthesizer 200 have shown that increasing the time for each test signal measurement from 15 micro seconds to 25 micro seconds reduces calculated error by a factor of about 1.6. However, some wireless system designs have a limited time budget for establishing a lock to the desired output frequency Fout, which includes the presently described calibration process.

According to another embodiment of the present invention, the frequency synthesizers 200 and 400 can be combined with each other to operate in a complementary manner to realize high speed calibration. For example, the frequency synthesizer 200 of FIG. 5 can be modified to include the peak detector 402, LUT 404, selector 406 and calibration controller 408, where the peak detector 402 is connected to receive the output of adjustable filter 106. The adjustable filter 106 of FIG. 5 is configured to be responsive to bandwidth control signal BW_CTL in addition to being responsive to gain estimator 206, and the adjustable filter 118 of FIG. 5 now receives the output of LUT 404.

In this alternate embodiment, referred to as the hybrid frequency synthesizer embodiment, the calibration circuits of FIG. 5 execute coarse calibration, followed by the calibration circuits of FIG. 7 which then execute fine calibration. Therefore, the calibration circuits of FIG. 5 can be operated in a relatively short time to quickly adjust the gain of adjustable filter 106. Once the gain for adjustable filter 106 has been set, the calibration circuits of FIG. 7 are then operated to select the most appropriate LUT entry from LUT 404 to adjust the gain of adjustable PE filter 118. Hence in this embodiment, both the gain of adjustable digital filter 106 and adjustable PE filter 118 can be adjusted during the calibration process.

Figure 8:
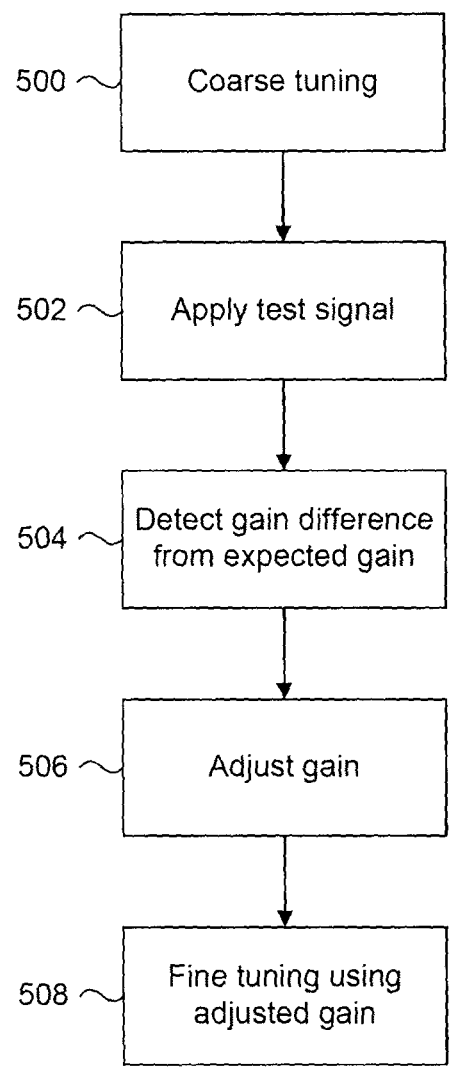
FIG. 8 is a flow chart illustrating a method for tuning a frequency synthesizer, according to a present embodiment.

FIG. 8 is a flow chart illustrating a method for tuning the frequency synthesizers of FIGS. 5, 7 and the above described alternate embodiment, with a closed loop frequency response compensation sub-routine according to a present embodiment. This method tunes Fout to a desired frequency, while making the necessary adjustments to compensate for the closed loop frequency response of the circuit thereby ensuring that the gain of Fout remains substantially constant. Reference will be made to the circuits of FIGS. 5 and 7 to illustrate how the calibration process is executed by both frequency synthesizers. The method starts at step 500 where coarse tuning of the circuit is executed under an open loop condition. In both FIGS. 5 and 7, coarse adjuster circuit 112 is set to tune VCO 110 to a predetermined frequency and iteratively samples Fout until convergence to a preliminary frequency proximate to the final desired frequency is reached. One technique for achieving this function is to count the number of Fout pulses within a fixed time period, and comparing this to a predetermined number corresponding to the desired frequency. This is done for a set number of iterations. By example, 25 iterations are executed where each iteration has a set time period of 1 micro second. Therefore, the coarse tuning step 200 can take up to 25 micro seconds. Once the coarse tuning is completed, the coarse adjustment signals are locked in, and the closed loop frequency response compensation sub-routine begins at step 502.

At step 502, the calibration controllers 202 and 408 signal selectors 204 and 406 respectively, to pass test signals into the circuit. In FIG. 5, the test signals include TEST_V1 and TEST_V2 while in FIG. 7, the test signals is the digital word TONE_WD corresponding to a preselected test tone. In FIG. 7, step 502 further includes increasing the bandwidth of adjustable filter 106, and it is assumed that a default configuration entry in LUT 404 is applied to adjustable pre-emphasis filter 118. Following at step 504, a determination of a difference between the expected gain and measured gain in the circuit is performed. In FIG. 5, step 504 includes measuring the frequencies corresponding to TEST_V1 and TEST_V2 at the output of VCO 110, and comparing the difference between the expected and measured combined tuning sensitivity of DAC 108 and VCO 110. In FIG. 7, step 504 includes measuring the peak output from adjustable filter 106 when the loop is closed, followed by calculating the tuning sensitivity parameter Kv*Kdac. The output of from adjustable filter 106 can be considered a preliminary output frequency since it is derived from the output of VCO 110. Peak detector 402 then compares the expected tuning sensitivity parameter to the one derived from the peak measurement.

At step 506, the gain of the circuit is adjusted in response to the determined gain difference. In FIG. 5, gain estimator 206 provides a gain adjustment signal to adjustable filter 106. This gain adjustment can be a digital signal that increases or decreases the gain provided by a digitally variable amplifier within adjustable filter 106. In FIG. 7, peak detector 402 provides a gain adjustment signal that controls LUT 404 to output a different stored configuration setting. The LUT 404 can be organized such that the configuration settings are stored in some ordered sequence. Therefore the gain adjustment signal or signals, can signal LUT 404 to increment or decrement to the next stored configuration setting. For the circuit of FIG. 5, the gain adjustment signal is determined after the second test signal TEST_V2 is applied. For the circuit of FIG. 7, several iterations may be required before the expected tuning sensitivity parameter and the one derived from the peak measurement converge or substantially match. In both FIGS. 5 and 7, the final gain adjustment signal is stored once the desired gain adjustment is determined. The closed loop frequency response compensation sub-routine is then terminated.

Following at step 508, closed loop fine tuning is executed by switching in the circuits used during normal operation. In FIG. 5, selector 204 passes the output of adjustable filter 106 to DAC 108. In FIG. 7, the bandwidth of adjustable filter 106 is switched back to the reduced normal range, and selector 406 passes MOD_WD to adjustable pre-emphasis filter 118.

The presently described method of FIG. 8 illustrates how a frequency synthesizer can be calibrated within a tuning operation by adjusting either the gain of the adjustable filter 106, or the gain of adjustable pre-emphasis filter 118. With reference to the previously described hybrid frequency synthesizer embodiment, the method steps 502 to 508 of FIG. 8 are executed a first time using the calibration circuits of FIG. 5 as described for FIG. 8 as part of the coarse calibration process. Then the gain of the adjustable filter 106 is set and method steps 502 to 508 are repeated again using the calibration circuits of FIG. 7 as described for FIG. 8 as part of the fine calibration process.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A method for generating an output frequency from a frequency synthesizer, comprising:
    a) coarse tuning a voltage controlled oscillator for generating a coarse tuned output signal at a preliminary frequency proximate to the output frequency;
    b) after coarse tuning, with the voltage controlled oscillator tuned to the coarse tuned output signal, applying at least one test signal to the frequency synthesizer once said coarse tuning is completed;
    c) determining a difference between a predetermined gain and actual gain of the coarse tuned output signal corresponding to the at least one test signal;
    d) adjusting gain of a circuit in the frequency synthesizer to compensate for the difference; and,
    e) fine tuning the voltage controlled oscillator for generating a fine tuned output signal at the output frequency.

2. The method of claim 1, wherein the step of applying includes applying a first test signal followed by a second test signal.

3. The method of claim 2, wherein the first test signal corresponds to a first voltage and the second test signal corresponds to a second voltage.

4. The method of claim 3, wherein the first test signal is a first digital word representing the first voltage and the second test signal is a second digital word representing the second voltage.

5. The method of claim 2, wherein the step of determining includes measuring a first output frequency in response to the first test signal and a second output frequency in response to the second test signal for calculating a measured tuning sensitivity.

6. The method of claim 5, wherein the step of adjusting includes generating a gain adjustment factor by dividing the measured tuning sensitivity by a desired tuning sensitivity.

7. The method of claim 6, wherein the step of adjusting includes changing a gain of a digitally adjustable filter by the gain adjustment factor.

8. The method of claim 7, wherein the step of applying includes selectively coupling the first test signal and the second test signal to an adjustable oscillation circuit that provides the first output frequency and the second output frequency during a calibration process.

9. The method of claim 8, wherein the step of fine tuning includes selectively coupling the digitally adjustable filter to the adjustable oscillation circuit that provides the output frequency.

10. The method of claim 1, wherein the frequency synthesizer includes a digital to analog converter for controlling a voltage controlled oscillator, and the step of applying includes:
    providing a test signal corresponding to a predetermined tone having an amplitude of $½^k$ to an adjustable pre-emphasis filter, where k is any integer value, and
    increasing a bandwidth of an adjustable digital filter by a factor of N, where N is an integer value greater than 1, and an output of the adjustable digital filter is designed to be $N*Fref/2^k(Kv*Kdac)$, where Fref is a reference frequency received by the frequency synthesizer, Kdac is the digital to analog converter tuning sensitivity, and Kv is the voltage controlled oscillator tuning sensitivity.

11. The method of claim 10, wherein the step of providing includes amplifying the test signal with the adjustable pre-emphasis filter in response to a default filter response configuration setting.

12. The method of claim 11, wherein the step of determining includes measuring a peak amplitude at the output of the digitally adjustable filter, and comparing the measured Kv*Kdac to a designed Kv*Kdac.

13. The method of claim 12, wherein the step of adjusting includes providing a new filter response configuration setting when the comparison mismatches.

14. The method of claim 1, wherein steps b) to d) are executed in a first iteration to provide coarse calibration of the frequency synthesizer, and steps b) to d) are executed in a second iteration to provide fine calibration of the frequency synthesizer prior to the step of fine tuning.

15. The method of claim 14, wherein the step of applying during the first iteration includes applying a first digital word and a second digital word to measure a first output frequency in response to the first digital word and a second output frequency in response to the second digital word, for calculating a coarse tuning sensitivity of the frequency synthesizer.

16. The method of claim 15, wherein the step of adjusting includes generating a gain adjustment factor by dividing the measured tuning sensitivity by a desired tuning sensitivity, and changing a gain of a digitally adjustable filter by the gain adjustment factor.

17. The method of claim 16, wherein the step of applying during the second iteration includes:
providing a predetermined tone having an amplitude of $\frac{1}{2}^k$ to an adjustable pre-emphasis filter receiving a default filter response configuration setting, where k is any integer value, and
increasing a bandwidth of an adjustable digital filter by a factor of N, where N is an integer value greater than 1, and an output of the adjustable digital filter is designed to be $N*Fref/2^k(Kv*Kdac)$, where Fref is a reference frequency received by the frequency synthesizer, Kdac is the digital to analog converter tuning sensitivity, and Kv is the voltage controlled oscillator tuning sensitivity.

18. The method of claim 17, wherein the step of determining includes measuring a peak amplitude at the output of the digitally adjustable filter, and comparing the measured Kv*Kdac to a designed Kv*Kdac.

19. The method of claim 18, wherein the step of adjusting includes providing a new filter response configuration setting when the comparison mismatches.

20. A closed-loop frequency synthesizer, comprising:
phase detection circuitry for providing a digital phase signal corresponding to a difference in phase between a reference clock and divided clock;
an adjustable digital filter for receiving the digital phase signal and providing a fine adjustment signal, the digital filter having at least one electrical characteristic adjustable during a calibration phase for determining a characteristic gain of the frequency synthesizer;
calibration circuitry for adjusting the at least one electrical characteristic of the adjustable filter during the calibration phase;
an adjustable frequency generator for generating an output frequency in response to the fine adjustment signal; and
a divider for dividing the output frequency by a selected factor to generate the divided clock.

21. The frequency synthesizer of claim 20, wherein the adjustable frequency generator includes:
a digital to analog converter for generating a fine adjustment signal in response to the filtered digital phase signal,
a coarse adjuster for generating a coarse adjustment signal in response to a difference between a predetermined output frequency and the output frequency,
a voltage controlled oscillator for generating the output frequency in response to the fine adjustment signal and the coarse adjustment signal.

22. The frequency synthesizer of claim 21, further including a selector for passing at least one test signal to the frequency synthesizer during the calibration phase.

23. The frequency synthesizer of claim 22, wherein the at least one test signal includes a first test signal corresponding to a first voltage and a second test signal corresponding to a second voltage, and the selector passes the first voltage and the second voltage to the digital to analog converter at different times.

24. The frequency synthesizer of claim 23, wherein the calibration circuitry includes a gain estimator for measuring a first output frequency corresponding to the first voltage and a second output frequency corresponding to the second voltage from the voltage controlled oscillator, the gain estimator calculating a measured tuning sensitivity and generating a gain adjustment factor by dividing the measured tuning sensitivity by a desired tuning sensitivity.

25. The frequency synthesizer of claim 24, wherein the at least one electrical characteristic of the adjustable digital filter includes gain being adjustable in response to the gain adjustment factor.

26. The frequency synthesizer of claim 22, wherein the at least one test signal includes a predetermined tone having an amplitude of $\frac{1}{2}^k$, where k is any integer value.

27. The frequency synthesizer of claim 26, further including an adjustable pre emphasis filter for amplifying the predetermined tone in response to changing filter response configuration settings for providing an amplified tone, and a sigma delta modulator for converting the amplified tone into a divide signal corresponding to the selected factor used by the divider.

28. The frequency synthesizer of claim 27, wherein the at least one electrical characteristic of the adjustable digital filter includes a bandwidth that is increased by a factor of N during the calibration phase, where N is an integer value greater than 1, and an output of the adjustable digital filter is designed to be $N*Fref/2^k (Kv*Kdac)$, where Fref is a reference frequency received by the frequency synthesizer, Kdac is the digital to analog converter tuning sensitivity, and Kv is the voltage controlled oscillator tuning sensitivity.

29. The frequency synthesizer of claim 28, wherein the calibration circuitry includes:
a peak detector for measuring a peak amplitude of the output of the adjustable digital filter, the peak detector comparing the measured Kv*Kdac to a designed Kv*Kdac; and
a lookup table for providing a new filter response configuration setting when the measured Kv*Kdac and the designed Kv*Kdac mismatch.

30. The frequency synthesizer of claim 27, wherein the adjustable digital filter has a filter gain adjusted during a coarse calibration operation of the calibration phase, and the adjustable pre emphasis filter has a filter gain adjusted during a fine calibration operation of the calibration phase.

31. A method for generating an output frequency from a frequency synthesizer, comprising:
a) coarse tuning a voltage controlled oscillator for generating a preliminary frequency proximate to the output frequency;
b) applying at least one test signal to the frequency synthesizer once said coarse tuning is completed, wherein the step of applying includes applying a first test signal followed by a second test signal;
c) determining a difference between a predetermined gain and actual gain corresponding to the at least one test signal, wherein the step of determining includes measuring a first output frequency in response to the first test signal and a second output frequency in response to the second test signal for calculating a measured tuning sensitivity;

d) adjusting gain of a circuit in the frequency synthesizer to compensate for the difference; and, e) fine tuning the voltage controlled oscillator for generating the output frequency.

32. A method for generating an output frequency from a frequency synthesizer, wherein the frequency synthesizer includes a digital to analog converter for controlling a voltage controlled oscillator, the method comprising:

a) coarse tuning the voltage controlled oscillator for generating a preliminary frequency proximate to the output frequency;

b) applying at least one test signal to the frequency synthesizer once said coarse tuning is completed, wherein the step of applying includes:

providing a test signal corresponding to a predetermined tone having an amplitude of $½^k$ to an adjustable pre-emphasis filter, where k is any integer value, and increasing a bandwidth of an adjustable digital filter by a factor of N, where N is an integer value greater than 1, and an output of the adjustable digital filter is designed to be $N*Fref/2^k(Kv*Kdac)$, where Fref is a reference frequency received by the frequency synthesizer, Kdac is the digital to analog converter tuning sensitivity, and Kv is the voltage controlled oscillator tuning sensitivity;

c) determining a difference between a predetermined gain and actual gain corresponding to the at least one test signal;

d) adjusting gain of a circuit in the frequency synthesizer to compensate for the difference; and, e) fine tuning the voltage controlled oscillator for generating the output frequency.

33. A method for generating an output frequency from a frequency synthesizer, comprising:

a) coarse tuning a voltage controlled oscillator for generating a preliminary frequency proximate to the output frequency;

b) applying at least one test signal to the frequency synthesizer once said coarse tuning is completed;

c) determining a difference between a predetermined gain and actual gain corresponding to the at least one test signal;

d) adjusting gain of a circuit in the frequency synthesizer to compensate for the difference; and, e) fine tuning the voltage controlled oscillator for generating the output frequency, wherein steps b) to d) are executed in a first iteration to provide coarse calibration of the frequency synthesizer, and steps b) to d) are executed in a second iteration to provide fine calibration of the frequency synthesizer prior to the step of fine tuning.

* * * * *